(12) United States Patent
Ganai et al.

(10) Patent No.: US 8,005,661 B2
(45) Date of Patent: Aug. 23, 2011

(54) MODELING AND VERIFICATION OF CONCURRENT SYSTEMS USING SMT-BASED BMC

(75) Inventors: Malay Ganai, Plainsboro, NJ (US); Aarti Gupta, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 498 days.

(21) Appl. No.: 12/116,668

(22) Filed: May 7, 2008

(65) Prior Publication Data
US 2008/0281563 A1 Nov. 13, 2008

Related U.S. Application Data

(60) Provisional application No. 60/916,331, filed on May 7, 2007.

(51) Int. Cl.
*G06F 9/45* (2006.01)
*G06F 9/455* (2006.01)
*G06F 7/60* (2006.01)
*G06F 12/00* (2006.01)
*G06F 13/00* (2006.01)

(52) U.S. Cl. ............................... 703/22; 703/2; 711/141
(58) Field of Classification Search .............. 703/2, 22; 711/141
See application file for complete search history.

(56) References Cited

OTHER PUBLICATIONS

Armando et al. "Bounded Model Checking of Software using SMT Solvers instead of SAT solvers", Jan. 2006, In: SPIN. vol. 3925 of LNCS, pp. 146-162.*
Clarke et al. "Behavioral Consistency of C and Verilog Programs Using Bounded Model Checking", 2003, Procedings of 40th Annual Design Automation Conference, pp. 369-371.*

* cited by examiner

*Primary Examiner* — Kamini S Shah
*Assistant Examiner* — Suzanne Lo
(74) *Attorney, Agent, or Firm* — Joseph Kolodka; Jeffery J. Brosemer

(57) ABSTRACT

A computer implemented method for modeling and verifying concurrent systems which uses Satisfiability-Modulo Theory (SMT)-based Bounded Model Checking (BMC) to detect violations of safety properties such as data races. A particularly distinguishing aspect of our inventive method is that we do not introduce wait-cycles in our symbolic models for the individual threads, which are typically required for considering an interleaved execution of the threads. These wait-cycles are detrimental to the performance of BMC. Instead, we first create independent models for the different threads, and add inter-model constraints lazily, incrementally, and on-the-fly during BMC unrolling to capture the sequential consistency and synchronization semantics. We show that our constraints provide a sound and complete modeling with respect to the considered semantics. One benefit of our lazy modeling method is the reduction in the size of the BMC problem instances, thereby, improving the verification performance in both runtime and memory.

13 Claims, 6 Drawing Sheets

| Thread $P_1$ | | Thread $P_2$ | |
|---|---|---|---|
| 1a. | $g_1 = 0; x = 0; l_1 = 0;$ | 1b. | $g_1 = 0; y = 0; l_1 = 0;$ |
| 2a. | $lock(l_1);$ | 2b. | $lock(l_1);$ |
| 3a. | if $(g_1 = 1)$ goto 6a; | 3b. | if $(g_1 = 0)$ goto 6b; |
| 4a. | $g_1 = 1;$ | 4b. | $g_1 = 0;$ |
| 5a. | $x++;$ | 5b. | $y++;$ |
| 6a. | $unlock(l_1);$ | 6b. | $unlock(l_1)$ |
| 7a. | $assert(x > 0);$ | 7b. | $g_1 = 1;$ |

FIG. 1

Lazy Modeling (a) CSR (b) CSR+PB (c) CSR+PB+CXT

Eager Modeling (d) CSR (e) CSR+PB (f) CSR+PB+CXT

MODELING AND VERIFICATION OF CONCURRENT SYSTEMS USING SMT-BASED BMC

CROSS REFERENCE TO RELATED APPLICATION

This application claims the benefit of U.S. Provisional Application No. 60/916,331 filed 7 May 2007 the entire file wrapper contents of which are incorporated herein as if set forth at length.

FIELD OF THE INVENTION

This invention relates generally to the field of computer software modeling and verification and in particular to a computer-implemented modeling and verification method for concurrent systems which does not introduce wait cycles in symbolic models of individual threads.

BACKGROUND OF THE INVENTION

The following papers provide useful background information, for which they are incorporated herein by reference in their entirety, and are selectively referred to in the remainder of this disclosure by their accompanying reference numbers in square brackets (i.e., [3] for the third numbered paper by Aspinall and Sevcik):

[1] S. V. Adve and K. Gharachorloo. Shared memory consistency models: A tutorial. *IEEE Computer*, 1996; [2] L. Lamport. How to make multiprocessor computer that correctly executes multiprocess programs. *IEEE Transactions on Computers*, 1979; [3] D. Aspinall and J. Sevcik. Formlising Java's data-race-free guarantee. Technical Report EDI-INF-RR-0958, School of Informatics, University of Edinburgh, 2007; [4] G. Ramalingam. Context sensitive synchronization sensitive analysis is undecidable. In *ACM Transactions on Programming Languages and Systems*, 2000; [5] P. Godefroid. Model checking for programming languages using verisoft. In *Proc. ACM Symposium on Principles of Programming Languages*, 1997; [6] T. Andrews, S. Qadeer, S. K. Rajamani, J. Rehof, and Y. Xie. ZING: Exploiting program structure for model checking concurrent software. In *Proc. of the Conference on Concurrency*, 2004; [7] P. Godefroid. Partial-order Methods for the Verification of Concurrent Systems An Approach to the State-explosion Problem. PhD thesis, 1995; [8] C. Flanagan and S. Qadeer. Transactions for software model checking. In *Proc. of TACAS*, 2003; [9] S. D. Stoller. Model-checking multi-threaded distributed Java programs. *International Journal on Software Tools for Technology Transfer*, 2002; [10] S. D. Stoller and E. Cohen. Optimistic synchronization-based statespace reduction. In *Proc. of TACAS*, 2003; [11] V. Levin, R. Palmer, S. Qadeer, and S. K. Rajamani. Sound transaction-based reduction without cycle detection. In *International SPIN Workshop on Model Checking of Software*, 2003; [12] Kenneth L. McMillan. *Symbolic Model Checking*. Kluwer Academic Publishers, 1993; [13] A. Biere, A. Cimatti, E. M. Clarke, and Y. Zhu. Symbolic model checking without BDDs. In *Proc. of TACAS*, 1999; [14] M. Sheeran, S. Singh, and G. Stalmarck. Checking safety properties using induction and a SAT solver. In *Proc. of FMCAD*, 2000; [15] R. Alur, R. K. Brayton, T. A. Henzinger, S. Qadeer, and S. K. Rajamani. Partial-order reduction in symbolic state space exploration. In *Proc. of CAV*, pages 340-351, 1997; [16] V. Kahlon, A. Gupta, and N. Sinha. Symbolic model checking of concurrent programs using partial orders and on-the-fly transactions. In *Proc. of CAV*, 2006; [17] I. Rabinovitz and O. Grumberg. Bounded model checking of concurrent programs. In *Proc. of CAV*, 2005; [18] F. Lerda, N. Sinha, and M. Theobald. Symbolic model checking of software. In *Electronic Notes Theoretical Computer Science*, 2003; [19] S. Qadeer and J. Rehof. Context-bounded model checking of concurrent software. In *Proc. of TACAS*, 2005; [20] B. Cook, D. Kroening, and N. Sharygina. Symbolic Model Checking for Asynchronous Boolean Programs. In *International SPIN Workshop on Model Checking of Software*, 2005; [21] O. Grumberg, F. Lerda, O. Strichman, and M. Theobald. Proof-guided Under-approximation-Widening for Multi-process Systems. In *Proc. ACM Symposium on Principles of Programming Languages*, 2005; [22] B. Dutertre and L. de Moura. A fast linear-arithmetic solver for DPLL(T). In *Proc. of CAV*, 2006; [23] R. Nieuwenhuis and A. Oliveras. DPLL(T) with exhaustive theory propagation and its application to difference logic. In *Proc. of CAV*, 2005; [24] C. Barrett, D. Dill, and Jeremy Levitt. Validity Checking for Combinations of Theories with Equality. In *Proc. of FMCAD*, November 1996; [25] M. Bozzano, R. Bruttomesso, A. Cimatti, T. Junttila, P. V. Rossum, M. Schulz, and R. Sebastiani. The MathSAT 3 system. In *Proc. Of CADE*, 2005; [26] M. K. Ganai and A. Gupta. Accelerating high-level bounded model checking. In *Proc. Intl. Conf. on Computer-Aided Design*, 2006; [27] S. V. Adve, M. D. Hill, B. P. Miller, and R. H. B. Netzer. Detecting data races on weak memory systems. In *Proc. of ISCA*, 1991; [28] Y. Yang, G. Gopalakrishnan, and G. Lindstrom. Memory-model sensitive data race analysis. In *Proc. of SPIN Workshop*, 2004; [29] S. Burckhardt, R. Alur, and M. M. K. Martin. CheckFence: Checking consistency of concurrent data types on relaxed memory models. In *Proc. of Programming Language Design and Implementation*, 2007; [30] Y. Yang, G. Gopalakrishnan, G. Lindstrom, and K. Slind. Nemos: A framework for axiomatic and executable specifications of memory consistency models. In *Proc. of IPDPS*, 2004; [31] L. Lamport. Time, clocks, and the ordering of events in a distributed system. *Communications of the ACM*, 1978; [32] Joint CAV/ISSTA Special Event. Specification, Verification, and Testing of Concurrent Software. http://research.microsoft.com/quadeer/cavissta.htm, 2004; [33] L. de Moura, H. Rue_, and M. Sorea. Lazy theorem proving for bounded model checking over infinite domains. In *Proc. of CADE*, 2002.; [34] A. Armando, J. Mantovani, and L. Platania. Bounded Model Checking of Software Using SMT Solvers Instead of Sat Solvers. In *International SPIN Workshop on Model Checking of Software*, 2006; [35] M. K. Ganai, A. Gupta, and P. Ashar. Efficient modeling of embedded memories in bounded model checking. In *Proc. of CAV*, 2004.; [36] F. Ivancic, Z. Yang, M. K. Ganai, A. Gupta, I. Shlyakhter, and P. Ashar. F-soft: Software verification platform. In *Proc. of CAV*, 2005; [37] SRI Team. Yices: An SMT solver; [38] D. Kroening, E. Clarke, and K. Yorav. Behavioral consistency of c and verilog programs using bounded model checking. In *Proc. of the Design Automation Conf.*, 2003.; and [39] F. Ivancic, Z. Yang, M. K. Ganai, A. Gupta, and P. Ashar. Efficient SAT-based Bounded Model Checking for Software Verification. In *International Symposium for Leveraging Applications of Formal Methods*, 2004.

The growth in number of inexpensive multi-processor systems and concurrent library support are making concurrent systems employing concurrent programming a very attractive approach for system designers. Unfortunately however, verification of concurrent systems remains a daunting task due in part to complex and unexpected interactions between asynchronous threads, and an assortment of architecture-specific memory consistency models [1] employed therein.

Various model checking efforts—both explicit and symbolic—for verifying concurrent systems having shared memory have been explored and described in the art. As known and described in the art, the general problem of verifying a concurrent system with even two threads with unbounded stacks is believed to be undecidable. Consequently, prior art verification efforts typically use incomplete methods or imprecise models—or sometimes both—to address the scalability of the problem.

Such prior art verification models are typically obtained by composing individual thread models using interleaving semantics, and model checkers are then applied to systematically explore the global state space. Well-known model checkers such as Verisoft and Zing explore states and transitions of the concurrent system using explicit enumeration. And while several state space reduction techniques based-on partial order methods and transactions-based methods have been proposed, these techniques do not scale well in general due to both state explosion and explicit enumeration.

As those skilled in the art will surely know, symbolic model checkers such as BDD-based SMV and SAT-based Bounded Model Checking (BMC) use symbolic representation and traversal of state space, and have been shown to be effective for verifying synchronous hardware designs. And while there have been efforts to combine symbolic model checking with the above mentioned state-reduction methods for verifying concurrent software, they unfortunately still suffer from a lack of scalability.

To overcome this limitation, some researchers have employed sound abstraction techniques with a bounded number of context switches while others have employed finite-state model abstractions with bounded depth analysis. These techniques may also be combined with a bounded number of context switches known a priori or a proof-guided method to discover them. Such efforts are generally geared toward state-reduction in the concurrent system model, and not toward size-reduction of the model checking instances.

Another development is the growing popularity of Satisfiability-Modulo Theory (SMT)-solvers. Due in-part to their support for richer expressive theories beyond Boolean logic coupled with several recent advancements, SMT-based methods are providing more scalable alternatives than BDD-based or SAT-based methods. Specifically, with several acceleration techniques, SMT-based BMC has been shown to scale better than SAT-based BMC for finding bugs. SMT-based BMC, therefore, is emerging as a potential replacement for SAT-based BMC for expressive models.

Simultaneously efforts have been made to detect bugs for weaker memory models. As is known a weak memory model increases the set of standard interleavings as it allows reordering of writes that may not follow program order, so as to capture the effect of write latency in an implemented memory architecture. Advantageously, one can check these models using axiomatic memory style specifications combined with constraint solvers. Note however that although these methods support various memory models they require a test program to address the scalability.

SUMMARY OF THE INVENTION

An advance is made in the art according to the principles of the present invention directed to a computer-implemented method for modeling and verification of concurrent systems having processes or threads communicating with shared variables and synchronization primitives. Our modeling preserves with respect to a property the set of all possible executions up to a bounded depth that satisfy the sequential consistency and synchronization semantics, without requiring an a priori bound on the number of context switches.

We use Satisfiability-Modulo Theory (SMT)-based Bounded Model Checking (BMC) to detect violations of safety properties such as data races. A particularly distinguishing aspect of our inventive method is that we do not introduce wait-cycles in our symbolic models for the individual threads, which are typically required for considering an interleaved execution of the threads. These wait-cycles are detrimental to the performance of BMC. Instead, we first create independent models for the different threads, and add inter-model constraints lazily, incrementally, and on-the-fly during BMC unrolling to capture the sequential consistency and synchronization semantics. We show that our constraints provide a sound and complete modeling with respect to the considered semantics. The main benefit of our lazy modeling framework is reduction in the size of the BMC problem instances, thereby, improving the verification performance in both runtime and memory.

We have implemented our techniques in a prototype SMT-based BMC framework, and demonstrate its effectiveness through controlled experiments on a concurrency benchmark.

BRIEF DESCRIPTION OF THE DRAWING

A more complete understanding of the present invention may be realized by reference to the accompanying drawing in which:

FIG. 1 illustrates a concurrent system having threads $P_1$ and $P_2$ with local variables x and y respectively interacting with lock $l_1$ and shared variable $g_1$;

DETAILED DESCRIPTION

Figure 2:
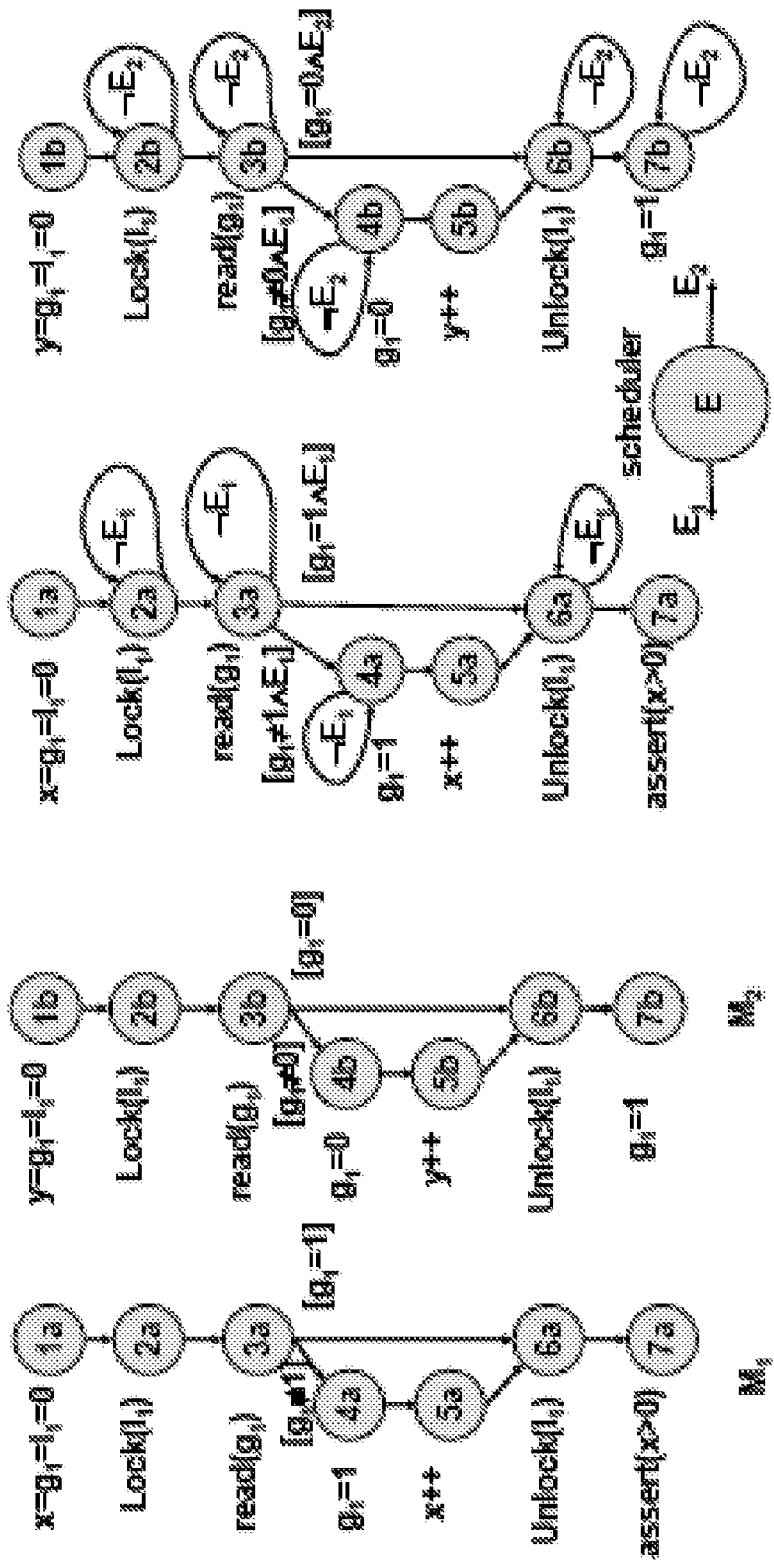
FIG. 2 is a set of Control Flow Graphs (CFG) of 2(a) CFG of $P_1$ and $P_2$; and 2(b) CFG of concurrent system with scheduler E.

The following merely illustrates the principles of the invention. It will thus be appreciated that those skilled in the art will be able to devise various arrangements which, although not explicitly described or shown herein, embody the principles of the invention and are included within its spirit and scope.

Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, the diagrams herein represent conceptual views of illustrative structures embodying the principles of the invention. We initially present an overview of the present invention and its design principles. At this point, we intentionally keep the description generic to the extent possible.

In the present invention, we focus on concurrency semantics based on sequential consistency. In these semantics, an observer has a view of only the local history of the individual threads where the operations respect the program order. Further, all the memory operations exhibit a common total order that respects the program order and has the read value property that the read of a variable returns the last write on the same variable in that total order.

In the presence of synchronization primitives such as locks/unlocks, the concurrency semantics also respect the mutual exclusion of operations that are guarded by matching locks. Sequential consistency is commonly used for software development due to ease-of programming, especially to obtain race-free, i.e., correctly synchronized threads. As used herein, a data race corresponds to a global state where two different threads access the same shared variable, and at least one of them is a write. It is also used to understand weaker memory models where race-freedom is typically defined using sequential consistency models.

Overview

We focus on verifying multi-threaded concurrent systems, where each thread communicates with other threads using shared variables and synchronization primitives. Further, we consider threads with bounded recursion, i.e., bounded stack. For such concurrent systems, we describe our efficient modeling and verification methodology that preserves the execution traces satisfying the sequential consistency and synchronization semantics up to a bounded depth. We augment SMT-based BMC to detect safety properties such as data races, in the concurrent system. We do not model a scheduler explicitly, but add precisely those constraints that capture the considered concurrency semantics.

We contrast our approach with an eager modeling of the concurrent system, i.e., a monolithic model composed with interleaving semantics (and possibly, with state-reduction constraints) enforced by an explicit scheduler, capturing all concurrent behaviors of the system eagerly. In our lazy modeling approach, we first create n independent models, each of which is a sound abstraction of the corresponding thread. These models do not have wait-cycles, i.e., self-loops on thread states. We unroll each model independently during BMC (i.e., with possibly different unroll depths) and add constraints between each pair of inter-model control states (or blocks) with shared accesses, that are statically reachable at the corresponding thread-specific depths.

These constraints guarantee sequential consistency by allowing sufficient context-switching to maintain the read value property, and sequentializing the context-switches to enforce a common total order. Note, the transition relation of each thread model ensures that memory accesses within the thread follow the program order.

Specifically, to capture context-switching events, we introduce a Boolean shared variable referred to as token. The semantics of a token asserted by a thread is equivalent to a guarantee that all visible operations, i.e., shared memory accesses, issued so far have been committed for other threads to see. Initially, only one thread (chosen non-deterministically) is allowed to assert its token.

The pair-wise constraints added between shared access states, allow passing of the value of token. To track the sequentiality of the global execution and maintain total order, we introduce global clock variables to timestamp the token passing events. Further, to maintain synchronization semantics, we only consider wait-free execution and disallow executions where the same lock is acquired twice in a row without an unlock. We later show that these constraints preserve the considered concurrency semantics, i.e., the set of all executions satisfying sequential consistency and synchronization semantics, up to a bounded depth.

As previously noted, our approach does not require the same unrolling depth in each thread. However, for ease of explanation and comparison, we use the same depth for each thread in the sequel. Each BMC instance at depth d comprises transition constraints of the individual models, i.e., program semantics unrolled up to d, concurrency constraints, i.e., concurrency semantics up to depth d, and property constraints, i.e., negated correctness criteria. We then translate each BMC instance into an SMT formula such that the formula is satisfiable iff there is a violation to the correctness property up to bound d. Thus, BMC is guaranteed not to generate a false alarm nor miss a witness, if one exists.

In short, our modeling is both sound and complete with respect to the considered semantics. In our approach, a data race condition is detected during BMC, if a witness trace exists where a token passing event occurs between thread states with shared accesses on the same variable, with at least one access being a write. We also detect multiple data races incrementally, by adding a blocking clause corresponding to the token passing events seen in the last witness trace to the satisfiable BMC instance, and then continuing the search.

At each unrolled BMC depth, we add constraints that capture precisely those concurrent behaviors that are added due to increase in the analysis depth. These newly added constraints, together with those added in the previous depths represent the concurrency constraints up to that depth. Note, these newly added constraints are computed on-the-fly. Thus, we add these constraints lazily, incrementally, and on-the-fly at each BMC unrolling, characterizing our lazy modeling paradigm. We show that the concurrency constraints grow quadratically with unrolling depth in the worst case.

In typical cases, the constraints can be further reduced using static analysis. As we show later, our lazy modeling paradigm naturally facilitates the use of several static analyses such as using context-sensitive control state reachability information, lockset analysis, and model transformations based on path/loop balancing. These analyses reduce the size of the transition and concurrency constraints in BMC instances dramatically, thereby, improving the performance of BMC by orders of magnitude.

We have implemented these techniques in our SMT-based BMC framework for verifying concurrent systems. We demonstrate the effectiveness of our lazy modeling approach in comparison to other approaches by controlled experiments on detection of data races in the Daisy file system benchmark.

One benefit of our lazy modeling paradigm for concurrent systems is that the size of the BMC instances are reduced thereby improving the performance of BMC in both runtime and memory. Accordingly, this improves the scalability of our approach. The benefits of our approach and their contributing factors may be summarized as follows.

Lazy modeling constraints: By adding the constraints lazily, i.e., as needed for a bounded depth analysis—as opposed to adding them eagerly—we reduce the BMC problem size at that depth. In the worst case, the size of these concurrency-modeling constraints depends quadratically on the number of shared memory accesses at any given BMC depth. Since the analysis depth of BMC bounds the number of shared memory accesses, these constraints are typically smaller than the model with constraints added eagerly, in practice.

No wait-cycle: We do not allow local wait cycles, i.e., there are no self-loops in read/write blocks with shared accesses. This enables us to obtain a reduced set of statically reachable blocks at a given BMC depth d, which dramatically reduces the set of pair-wise concurrency constraints that we need to add to the BMC problem.

Deeper analysis: For a given BMC depth D and n concurrent threads, we guarantee finding a witness trace, i.e., a sequence of global interleaved transitions of length $\leq n \cdot D$, (if it exists), where the number of local thread transitions is at most D. In an eager modeling approach using BMC, an unrolling depth of $n \cdot D$ is needed to detect a witness of length $n \cdot D$. This provides potential memory savings of a factor of n.

Using static analysis: We use property preserving model transformations such as path/loop balancing, and context-sensitive control state reachability to reduce the set of blocks that are statically reachable at a given depth. Again, this potentially reduces the set of pair-wise concurrency constraints that we need to add to the BMC problem. We also use lockset analysis to reduce the set of constraints, by statically identifying which block pairs (with shared accesses) are simultaneously unreachable.

SMT-based BMC: We use an SMT solver instead of a traditional SAT solver, so that we can express the BMC formula succinctly, without bit-blasting. In this framework, we effectively capture the exclusivity of the pair-wise constraints, i.e., for a chosen shared access pair, other pairs with a common access are implied invalid immediately.

Extended Finite State Machine (EFSM)

An EFSM model is a 5-tuple $(s_0, C, I, D, T)$ where, $s_0$ is an initial state, C is a set of control states (or blocks), I is a set of inputs, D is a set of state (datapath) variables (with possibly infinite range), and T is a set of 4-tuple $(c, g, u, c')$ transitions where $c, c' \in C$, g is a Boolean-valued enabling condition (or guard) on state and input variables, u is an update function on state and input variables.

An ordered pair $(c, x) \in C \times D$ is called a configuration of M. A transition from a configuration $(c, x)$ to $(c', x')$ under enabling predicate $g(x, i)$ is represented as $$(c, x) \xrightarrow{g(x,i)} (c', x').$$

For ease of description, we consider deterministic EFSMs where for any two transitions from a control state c, i.e., $$(c, x) \xrightarrow{f(x,i)} (c', x').$$

and $$(c, x) \xrightarrow{g(x,i)} (c'', x''),$$

enabling predicates f and g are mutually exclusive. We define an NOP state as a control state with no update transition, and a single incoming (outgoing) transition.

Concurrent System Model

We consider a concurrent system comprising a finite number of deterministic bounded-stack threads communicating with shared variables, some of which are used as synchronization objects such as locks. Each thread has a finite set of control states and can be modeled as an EFSM.

Formally, we define a concurrent system model CS as a 4-tuple $(M, V, T, s_0)$, where M denotes a finite set of EFSM models, i.e., $M = \{M_1, \ldots, M_n\}$ with $M_i = (s_{0i}, C_i, I_i, D_i \cup V, T_i)$, V denotes a finite set of shared variables i.e., $V = \{g_1, \ldots, g_m\}$, T denotes a finite set of transitions, i.e., $T = \bigcup T_i$, $s_0$ denotes the initial global state. A global state (or configuration) s of CS is a tuple $(s_1, \ldots, s_n, v) \in S = (C_1 \times D_1) \ldots \times (C_n \times D_n) \times V$ where $s_i \in C_i \times D_i$ and v denotes the values of the shared global variables $g_j$. Note, $s_i$ denotes the local state tuple $(c_i, x_i)$ where $c_i$ represents the local control state component of $s_i$, and $x_i$ represents the local state variables. A global transition system of CS is an interleaved composition of the individual EFSM models, $M_i$. Each transition consists of global firing of a local transition $t_i = (a_i, g_i, u_i, b_i) \in T$, denoted as $$a_i \xrightarrow{t_i} b_i$$

where $a_i$ and $b_i$ are control states of the EFSM model $M_i$. In a given global state s the local transition $t_i$ of model $M_i$ is said to be scheduled if $c_i = a_i$, where $c_i$ is the local control state component of $s_i$. Further, if enabling predicate $g_i$ evaluates to true in s, we say that $t_i$ is enabled. Note that—in general—more than one local transition of model $M_i$ can be scheduled but exactly one of them can be enabled (as $M_i$ is a deterministic EFSM).

The set of all transitions that are enabled in a state s is denoted by enabled(s). We use $$s \xrightarrow{t} s'$$

to denote that execution of t changes the global state from s to $$s', s \xRightarrow{w} s'$$

denote that a finite sequence of transitions w leads from s to s'. A global transition system of CS is denoted by $(S, \Delta, s_0)$ where $\Delta \subseteq S \times S$ is the transition relation defined by $$(s, s') \in \Delta \text{ iff } \exists t \in T: s \xrightarrow{t} s';$$

and $s_0$ is the initial state of CS.

We obtain a synchronous execution model for such concurrent system by defining a scheduler E: $M \times S \mapsto \{0,1\}$ so that t is said to be executed at global state s, iff $t \in$ enabled(s) $\cap T_i$ and $E(M_i, s) = 1$. Note that—in interleaved semantics—at most one enabled transition can be executed at a global state s. In such a synchronous execution model, each thread model typically has wait-cycles, i.e., self-loops on each local state $s_i$. These wait-cycles allow exploration of all possible interleavings of transitions from s. Later, we will show that such models with wait-cycles are not a good modeling paradigm in the context of BMC.

Example: We illustrate a concurrent system comprising of threads $P_1$ and $P_2$ with local variables x and y, respectively, interacting with lock $l_1$ and shared variable $g_1$, as shown in FIG. 1. Each numbered statement is atomic, i.e., it cannot be interrupted.

Deterministic EFSM models $M_1$ and $M_2$ of the two threads $P_1$ and $P_2$ are shown as control flow graphs (CFG) in FIG. 2(a). Note that $M_1$ is the tuple $(c_{01}, C_1, I_1, D_1, T_1)$ with $c_{01}$=1a, $C_1$={1a, . . . , 7a}, $I_1$={ }, $D_1$={x}∪{$g_1, l_1$}. The transitions are shown by directed edges with enabling predicates (if not a tautology) shown in square brackets and update functions are shown on the side of each control state. The model $M_2$ is similarly defined.

An interleaved model for the concurrent system with threads $P_1$ and $P_2$, i.e., $$CS=(\{M_1,M_2\},\{g_1,l_1\},\{T_1,T_2\},((1a,x),(1b,y),(g_1,l_1))),$$

with global shared variable $g_1$ and lock variable $l_1$, and a scheduler E is shown in FIG. 2(b). It is obtained by inserting a wait-cycle, i.e., a self-loop at each control state of model $M_i$ and associating the edge with a Boolean guard $E_i$ such that $E_i$=1 iff $E(M_i, s)$=1.

To understand the need for such wait-cycles, consider a global state s with thread control states at 2a and 6b, respectively. To explore both the interleaving $2a \to 3a$ and $6b \to 7b$ from s, each thread needs to wait when the other makes the transition. Noting that the transitions at control states 5a, 7a, and 5b correspond to non-shared memory accesses, one can remove the self-loops at these control states. Using partial-order reduction techniques, one can constrain the scheduler to generate a subset of all possible tuples $(E_1, E_2)$ at any given global state [?].

Concurrency Semantics

We are now in position to state the following concurrency semantics based on sequentially consistent model [see, e.g., 30, 31].

Program Order Rule: Shared accesses, i.e. read/write to shared variables, should follow individual program semantics.

Total order Rule: Shared accesses across all threads should have a total order.

Read Value Rule: A read access of a shared variable should observe the effect of the last write access to the same variable in any total order.

Mutual exclusion Rule: Shared accesses in matched locks/unlock operations should be mutually exclusive.

SMT-Based BMC

As those skilled in the art will surely recognize and understand, BMC is a model checking technique where falsification of a given LTL property is checked for a given sequential depth, or bound [13, 14]. A propositional translation in the presence of large data-paths leads to a large Boolean formula; which is normally detrimental to a SAT-solver due to increased search space. SMT-based BMC overcomes the above limitation; wherein, a BMC problem is translated typically into a quantifier-free formula in a decidable subset of first order logic, and the formula is then checked for satisfiability using an SMT solver. With advent of sophisticated SMT solvers [22-25] built over DPLL-style SAT solvers, and several acceleration techniques using control flow information and model transformation, SMT-based BMC [26, 33, 34] is gaining in popularity.

Control State Reachability (CSR) and CFG Transformations

Control state reachability (CSR) is a breadth-first traversal of the CFG (corresponding to an EFSM model), where a control state b is one step reachable from a iff there is an enabling transition $a \to b$.

At a given sequential depth d, let R(d) represent the set of control states that can be reached statically, i.e., ignoring the guards, in one step from the states in R(d−1), with R(0)=$s_0$. For some d, if R(d−1)≠R(d)=R(d+1), we say the CSR saturates at depth d. Computing CSR for the CFG of $M_1$ shown in Figure ?, we obtain the set R(d) for d=0 . . . 6 as follows: R(0)={1a}, R(1)={2a}, R(2)={3a}, R(3)={4a,6a}, R(4)={5a,7a}, R(5)={6a}, R(6)={7a}. CSR can be used to reduce BMC instance size [26]. Basically, if a control state r∉R(d), then the unrolled transition relation of variables that depend on r can be simplified.

For example, we define a Boolean predicate $B_r \equiv (PC=r)$, where PC is the program counter that tracks the current control state. Let $v^d$ denote the unrolled variable v at depth d during BMC unrolling. Basic idea is illustrated as follows for thread model $M_1$, where the next state of variable $g_1$ is defined as next($g_1$)=$B_{1a}$?0: $B_{4a}$?1: $g_1$ (using C language notation ?,: for cascaded if-then-else). At depths k∉{0,3}, $B_{1a}^k = B_{4a}^k = 0$ since 1a,4a∉R(k).

Using this unreachability control state information, we can hash the expression representation for $g_1^{k+1}$ to the existing expression $g_1^k$, i.e., $g_1^{k+1} = g_1^k$. This hashing, i.e., reusing of expression, considerably reduces the size of the logic formula, i.e., the BMC instance. Note, a large cardinality of the set R(d), i.e., |R(d)|, reduces the scope of above simplification and hence, the performance of BMC. Re-converging paths of different lengths and different loop lengths are mainly responsible for saturation of CSR [26]. Note that saturation of CSR leads to large |R(d)|.

To avoid saturation, a strategy called Balancing Re-convergence has been proposed [26] that transforms an EFSM by inserting NOP states such that lengths of the re-convergent paths and loops are the same. Note also that a NOP state does not change the transition relation of any variable.

Such path and loops balancing techniques have been shown to be very effective in accelerating BMC [26].

EXAMPLE

For the CFG of $P_1$ shown in FIG. 2(a), the reconverging paths $3a \to 6a$ and $3a \to 4a \to 5a \to 6a$ can be balanced by inserting two NOPs between $3a \to 6a$.

Motivation: Why Wait-Cycles are Bad?

Computing CSR on the concurrent model shown in FIG. 2(b), we obtain the reachable set R(d) as follows:

$R(0)=\{1a,1b\}$ $R(1)=\{2a,2b\}$ $R(2)=\{2a,3a,2b,3b\}$ $R(3)=\{2a,3a,4a,6a,2b,3b,4b,6b\}$ $R(4)=\{2a,3a,4a,5a,6a,7a,2b,3b,4b,5b,6b,7b\}$ $R(5)=\{R(4)\}$

Saturation at depth 5 is clearly inevitable due to the presence of self-loops. This results in a very restricted simplification during BMC. The saturation adversely affects the size of the unrolled BMC instances as the scope for reusing the expression for next state logic expression is reduced heavily.

In general, acceleration techniques for BMC [26] are more effective when the statically reachable set of non-NOP control states is small. Therefore, as a first step for scalable BMC, we are motivated to propose a modeling paradigm that eliminates self-loops. However, there are lots of challenges in doing so in a BMC framework. We would like to have soundness and completeness, i.e., preserve the considered concurrency semantics up to a bounded depth. We also would like to formulate and solve iterative BMC problem incrementally, and integrate seamlessly state-of-the-art advancements in BMC. In the following section, we discuss a lazy modeling paradigm that achieves this, and simultaneously facilitates the use of several static techniques such as context-sensitive CSR and lockset analysis [8,9,16] and model transformations [26] to accelerate the performance of BMC by orders of magnitude.

Lazy Modeling of Concurrent Systems

Figure 3:
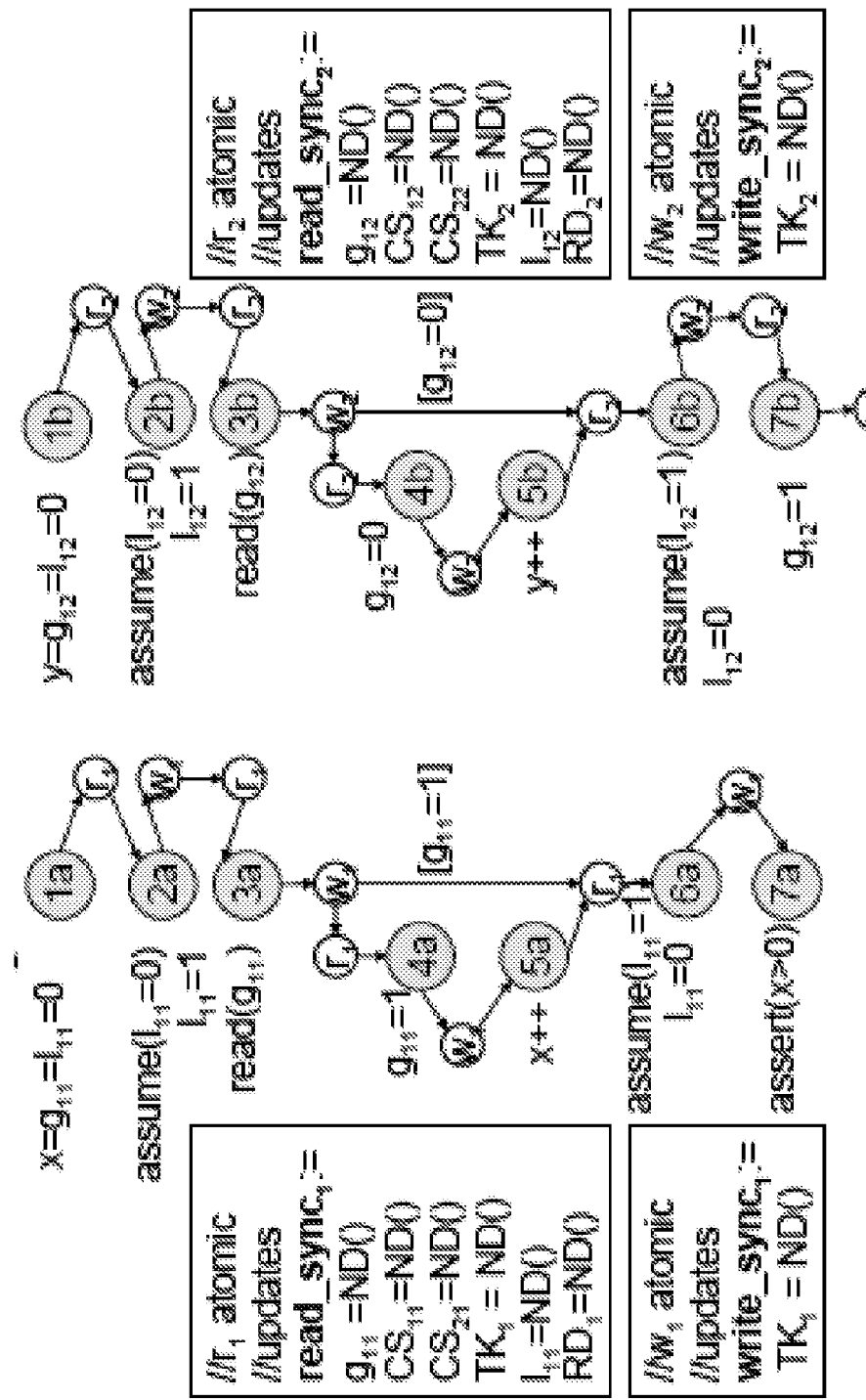
FIG. 3 is a CFG of threads $P_1$ and $P_2$ with annotations.

With the concurrency semantics rules stated earlier, we are now in position to discuss our lazy modeling approach. in Section Sound Abstraction Independent Thread Models We make following annotations in the thread programs, so that we can directly use a model builder for sequential programs and obtain sound abstraction. The independent abstract thread models $LM_1$ and $LM_2$—obtained after annotating our running example (FIG. 1) are shown in FIG. 3.

Token: We introduce a global Boolean variable, a token TK, to signify that the thread with the token can execute a shared access operation and commit its current shared state to be visible to the future transitions. Initially, only one thread, chosen nondeterministically, is allowed to assert TK. Later, this token is passed, from one thread to another, i.e., de-asserted in one thread and asserted by the other thread, respectively.

Logical Clock: To obtain a total ordering on token passing events, we use the concept of logical clocks and timestamp [31]. More particularly, we add a global clock variable $CS_i$ for each thread $P_i$ so that the tuple $(CS_1 \ldots CS_n)$ represents the logical clock. These variables are initialized to 0. Whenever a token TK is acquired by a thread $P_i$, $CS_i$ is incremented by 1 in $P_i$. The variable $CS_i$ keeps track of the number of occurrences of token passing events wherein thread $P_i$ acquires the token from another thread $P_j$, $j \neq i$.

Race Detector: We add a race detector local Boolean variable $RD_i$ for each thread $P_i$. These variables are initialized to 0.

Localization: For each thread, we make the global variables localized by renaming. For Example, as shown in FIG. 3, for $P_1$, we rename $g_1$, $l_1$, TK, $CS_1$, and $CS_2$ to local variables $g_{11}$, $l_{11}$, $TK_1$, $CS_{11}$, and $CS_{21}$, respectively.

Atomic Procedures: To allow context switching between threads, we add atomic thread specific procedures read_sync and write_sync before and after every shared access. In the read_sync procedure, each localized shared and race detector variable get a non-deterministic value denoted as ND ( ). In the write_sync procedure only TK gets a ND ( ) value.

For Example, in FIG. 3, the control states ri and wi correspond to the procedures read_sync and write_sync calls, respectively. They are shown as inlined only for ease of understanding. Our modeling paradigm does not depend on whether these procedures are inlined or not.

Synchronization primitives: Operations lock (lk) and unlock (lk) are modeled as atomic operations lk=1 and lk=0, respectively. Similar to [17], we only consider wait-free execution, i.e., where lock/unlock operations succeed. We achieve that by adding assume (lk=0) and assume (lk=1) in lock/unlock operations respectively. For Example, we model lock/unlock in states 2a, 2b, 6a, and 6b as shown in FIG. 3.

The models obtained with these annotations are independent as the update transition relation for each variable depends only on the other local state variables. Due to non-deterministic read values for shared variables in read sync procedure, each of these models has additional behaviors. Note, there are no wait-cycles in these models.

Concurrency Constraints

Given independent abstract models, obtained as above, we add concurrency constraints incrementally, and on-the-fly during BMC unrolling. The concurrency constraints capture inter- and intra-thread dependencies due to interleavings, and thereby, eliminate additional behaviors and independency in the models up to a bounded depth. We first compute CSR on each of the models $LM_i$ separately, and obtain the set of reachable control states $R_i(d)$, where D is the BMC bound. In the following, $x_i^k$ denotes the unrolled expression for the variable x of model $LM_i$ at depth k.

Single Token Constraint: Initially, exactly one thread model has the token, i.e., $$\left(\bigvee_{1 \leq i \leq n} TK_i^0\right) \bigwedge \left(\bigwedge_{i \neq j} TK_i^0 \Rightarrow \neg TK_j^0\right)$$

Read-Write Synchronization Enabling Constraint: For every pair of read sync control state in $LM_i$, $r_i \in R_i(k)$ and write sync control state in $LM_j$, $j \neq i$, $w_j \in R_j(h)$, we introduce a Boolean variable $RW_{ij}^{kh}$, and add following enabling constraint:

$$RW_{ij}^{kh} \Longleftrightarrow (B_{r_i}^k \wedge TK_i^k \wedge B_{w_j}^k \wedge TK_j^h$$
$$\neg CS_{ii}^k = CS_{ij}^h)$$

In other words, we require that R $RW_{ij}^{kh}=1$ iff a) thread model $LM_i$ is in read sync control state at depth k and does not hold the token, b) thread model $LM_j$ is in write sync control state at depth h and holds the token, and c) thread model $LM_j$ has the latest value of clock variable of $LM_i$, and both threads agree on that. If $RW_{ij}^{kh}=1$, we say, the token passing condition is enabled. Note, this constraint per se is not enough for token passing, and we require the following exclusivity constraint as well.

Read-Write Synchronization Exclusivity Constraint: Let $RS_i^k$ define the set $\{\{RW_{ij}^{kh} | i \neq j, 0 \leq h \leq d\}$ for a read sync control state of $LM_i$ at depth k. To allow at most one write sync (from a different thread) to match with this read sync, we assign a unique id $a_j^h \neq 0$ to each element of $RS_i^k$. We add a new variable $RC_i^k$ for the read sync control state of $LM_i$ at depth k, require that it takes value $a_j^h \neq 0$ iff $RW_{ij}^{kh}=1$. Similarly, we introduce a new variable $WC_j^h$ for the write sync control state of $LM_j$ at depth h, and require that it takes value $b_i^k \neq 0$ iff $RW_{ij}^{kh}=1$.

The constraints added are:

$$RW_{ij}^{kh} \Longleftrightarrow (RC_i^k = a_j^h), a_j^h \neq 0 \quad (3)$$

$$RW_{ij}^{kh} \Longleftrightarrow (WC_j^h = b_i^k), b_i^k \neq 0 \quad (4)$$

Figure 4:
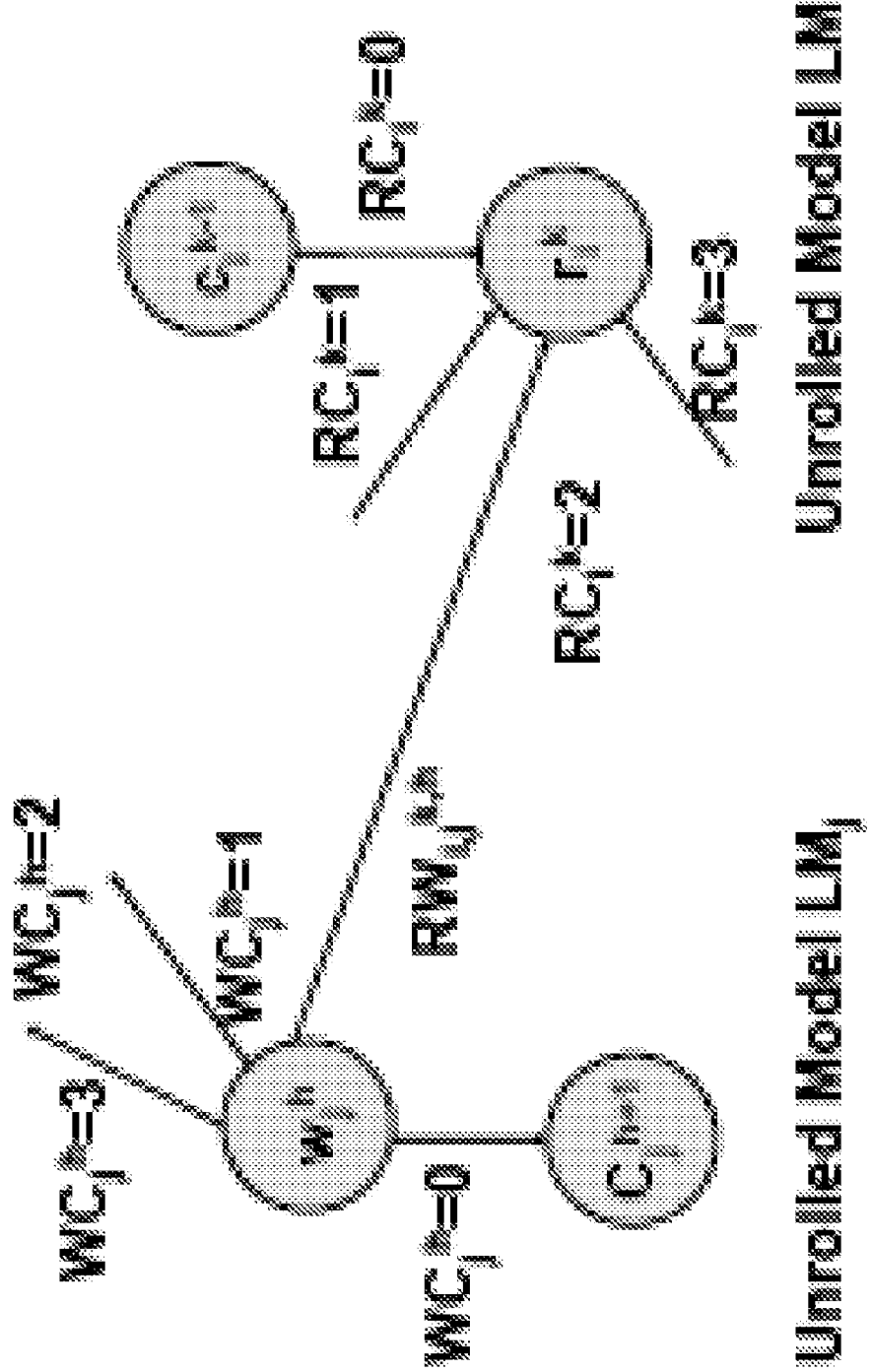
FIG. 4 is a CFG showing Read-Write Synchronization constraint with exclusivity.

Thus, if $RW_{ij}^{kh}=1$, we require that both $RC_i^k \neq 0$ and $WC_j^h \neq 0$; and vice-versa. Exclusivity constraints ensure that for a chosen pair $(r_i^k, w_j^h)$ with $i \neq j$, other pairs such as $(r_i^k, w_{j'}^{h'})$ with $j \neq j'$ and $(r_{i'}^{k'}, w_j^h)$ with $i \neq i'$ are implied invalid. A similar idea has been applied previously [35] for memory modeling in SAT-based BMC. We illustrate exclusivity modeling in FIG. 4. Note, Eq. 2, together with Eqs 3 and 4 define $RW_{ij}^{kh}$. We say a token passing event is triggered iff $RW_{ij}^{kh}=1$.

Read-Write Synchronization Update Constraint: For every $RW_{ij}^{kh}$ variable introduced, we add the following update constraints:

$$RW_{ij}^{kh} \Rightarrow \bigwedge_{p=1}^{m} g_{pi}^{k+1} = g_{pj}^{h} \quad (5)$$

$$RW_{ij}^{kh} \Rightarrow (TK_i^{k+1} \wedge \neg TK_j^{h+1}) \quad (6)$$

$$RW_{ij}^{kh} \Rightarrow (CS_{ii}^{k+1} = CS_{ii}^k + 1) \bigwedge \left(\bigwedge_{q=1, q \neq i}^{n} CS_{qi}^{k+1} = CS_{qj}^h\right) \quad (7)$$

Stated alternatively, if the token passing event is triggered, each localized shared variable of $LM_i$ at depth k gets the current state value of the corresponding localized shared variable of $LM_j$ at depth h (Eq. 5), the next state value of token of $LM_i$ is constrained to 1, while it is constrained to 0 for $LM_j$, indicating transfer of token value (Eq. 6), the next state value of clock variable of $LM_i$ is incremented by 1, while the remaining clock variables are sync-ed with that of $LM_j$ (Eq. 7).

No Sync Update Constraint: When none of the token passing events is triggered for a read_sync control state of $LM_i$ at depth k, we force the next state values to be unchanged for each localized shared and race detector variable in $LM_i$ by adding the following constraints:

$$RC_i^k = 0 \Rightarrow \left( \bigwedge_{p=1}^{m} g_{pi}^{k+1} = g_{pi}^{k} \right) \bigwedge (RD_i^{k+1} = RD_i^k) \quad (8)$$

$$RC_i^k = 0 \Rightarrow TK_i^{k+1} = TK_i^k \quad (9)$$

$$RC_i^k = 0 \Rightarrow \bigwedge_{q=1}^{n} CS_{qi}^{k-1} = CS_{qi}^k \quad (10)$$

Similarly, for every write_sync control state of $LM_j$ at depth h, we force the next state token value to be unchanged by adding a similar constraint, namely:

$$WC_j^h = 0 \Rightarrow TK_j^{h+1} = TK_j^h \quad (11)$$

Lock/Unlock Synchronization Constraint: For modeling assume (lk=0) function in lock control state $l_i$ of $LM_i$ at depth k, and similarly, for unlock control state $ul_i$, we add the constraints, $$B_{l_i}^k \Rightarrow (\neg lk_i^k); B_{ul_i}^k \Rightarrow (lk_i^k) \quad (12)$$

Write Commit Constraint: We make only a write operation commit its current shared state to be visible to the future transitions. This is achieved by adding the following constraint in write_sync control state $w_j$ of $LM_j$ at depth h corresponding to write operation only, i.e., $$B_{w_j}^h \Rightarrow TK_j^h \quad (13)$$

Data Race Detection Property Constraint: We define two predicates will_access and just_written statically, where will_access($r_i$,g)=1 iff shared variable g is accessed in the next local control state transition from $r_i$, and just_written($w_j$,g)=1 iff shared variable g was written in the previous local control state transition to $w_j$. We add the following race detection constraint only if will_access($r_i$,g)=1 and just_written ($w_j$,g)=1:

$$RW_{ij}^{kh} \Rightarrow RD_i^{k+1} \quad (14)$$

Single Control State Reachability Property Constraint: For checking reachability of a local control state $a \in C_i$, we add the following constraint:

$$B_a^k \Rightarrow TK_i^k \quad (15)$$

Pair-wise Control State Reachability Property Constraint: For checking if control states $a \in C_i$ (of $LM_i$) and $b \in C_j$ (of $LM_j$) are reachable simultaneously, we reduce the reachability problem to data race detection by adding control states read_sync and write_sync before and after control states a and b.

Multiple Race Detections: For checking multiple data races incrementally, we add the following blocking clause corresponding to the token passing events seen in the last witness trace, to BMC formula.

$$\neg (RW_{ij}^{kh} \wedge \ldots \wedge RW_{i'j'}^{k'h'}) \quad (16)$$

To summarize, our concurrency constraints comprise pair-wise constraints, i.e., Eq. 2-7 and 14, single-thread constraints, i.e., Eq. 8-13 and 15, and a single constraint, i.e., Eq. 1.

Building Models from C Threads

We may now briefly discuss our model building step (similar to [36]) from a given C program with bounded heap and stack. We first obtain a simplified CFG by flattening the structures and arrays into scalar variables of simple types (Boolean, integer, float), handling pointer accesses using direct memory access on a finite heap model, applying standard slicing and constant propagation, and not-inlining non-recursive procedure to avoid blow up, but bounding and inlining recursive procedures. We extract matching call-return sites for each function for performing context-sensitive reachability analysis. We perform merging of control nodes in CFG involving parallel assignments to local variables into a basic block, where possible, to reduce the number of such blocks. We, however, keep each shared access as a separate block to allow context-switches. From the simplified CFG, we build an EFSM with each block being identified with a unique id value, and a control state variable PC denoting the current block id. We construct a symbolic transition relation for PC that represents the guarded transitions between the basic blocks. For each data variable, we add an update transition relation based on the expressions assigned to the variable in various basic blocks in the CFG. We use Boolean expressions and arithmetic expressions to represent the update and guarded transition functions.

Correctness Theorem

We now state the following theorem that addresses the soundness and completeness of our inventive modeling approach.

Theorem 1. The lazy modeling constraints (Eq. 1-15) allow only those traces that respect the sequential consistency of memory model and synchronization semantics up to the bound D, i.e., our modeling is sound.

Further if their exists a witness for a reachability property, such that the global trace length is $\leq n \cdot D$ and each local trace length is $\leq D$, then there exists an equivalent trace allowed by our model corresponding to the witness trace. In other words, our modeling is complete in that it does not miss any witness up to these bounds.

Proof: Here is an outline of the proof

Soundness: Our modeling captures the requirements for sequential consistency presented earlier, i.e., (a) program order: using the transition relation of each thread model and No Sync Update Constraint (Eq. 8), (b) total order of share accesses: using logical clock along with Read-Write Synchronization (Eq. 6 and 7) and No Sync Update Constraint (Eq. 9 and 10), (c) read value rule: using Read-Write Synchronization Constraint (Eq. 5), No Sync Update Constraint (Eq. 8), and Write Commit Constraint (Eq. 13), and (d) mutual exclusion rule: using Lock/Unlock Synchronization Constraint (Eq. 12).

Completeness: We add pair-wise constraints for all pairs of shared accesses that are statically reachable up to the bounded depth. Thus, we capture all possible interleavings of shared accesses up to the bound, and therefore we cannot miss any witness up to the bound.

Size of Concurrency Constraints/Variables

We may now discuss the size of constraints and variables incrementally added at each depth d for n concurrent threads. We consider thread specific read_sync and write_sync procedure calls, without inlining. This requires that at each untolled depth k of $LM_i$, at most one read_sync control state $r_i$ and at most one write_sync control state $w_i$ belong to the reachable set $R_i(k)$. Thus, at depth d, $r_i$ (or $w_i$) block is paired with at most $(n \cdot d) w_j$ (or $r_j$) blocks. Since there are n threads, we have at most $(n^2 \cdot d)$ pairs. Thus, at depth d, the number of pair-wise constraints added, and variables introduced are O(d), and number of non-pair constraints added is O(1). Overall, the size of constraints and variable s added up to depth d is $O(d^2)$. Thus the concurrency constraints grow quadratically with untolling in the worst case. For X memory accesses up to depth d, the size complexity can be shown to be $O(X^2)$. By way of comparison, previous approaches [28, 29], inclur a cubic cost i.e., $O(X^3)$ for a given memory model and a test program.

Reducing Concurrency Constraints

We further reduce the size of constraints and variables by exploiting the following static analysis on thread models.

CFG transformation (PB): We use path/loop balancing transformations [26] on each thread model independently to obtain a reduced set of statically reachable blocks in CSR. Advantageously, this also reduces the set of pair-wise constraints in addition to the transition constraints.

Lockset-based analysis (MTX): We determine statically pair-wise unreachability of read_sync and write_sync control states using a lockset [8, 9, 16] analysis. For such pairs of read_sync and write_sync control states that are mutually exclusive (e.g., due to matching locks/unlocks), we do not add pair-wise constraints as the concurrency semantics forbid context-switching between those thread states.

Context-Sensitive CSR (CXT): For our modeling, we assume that procedures in threads are not inlined, otherwise the models tend to blow up due to an exponential number of execution paths. However, not-inlining a procedure can cause false loops in the CFG of each thread, due to unmatched calls/returns of a procedure. Recall that the presence of loops—in general—saturates CSR at smaller depths thereby worsening BMC performance [26]. We avoid saturation due to false loops in CSR by determining reachability in a context-sensitive manner, i.e., by matching the call/return sites for each procedure call. We observe in our experimental results that such analysis gives a dramatically reduced set of reachable read_sync and write_sync control states, and hence a reduction in the set of pair-wise constraints added.

Overall Method

Figure 6:
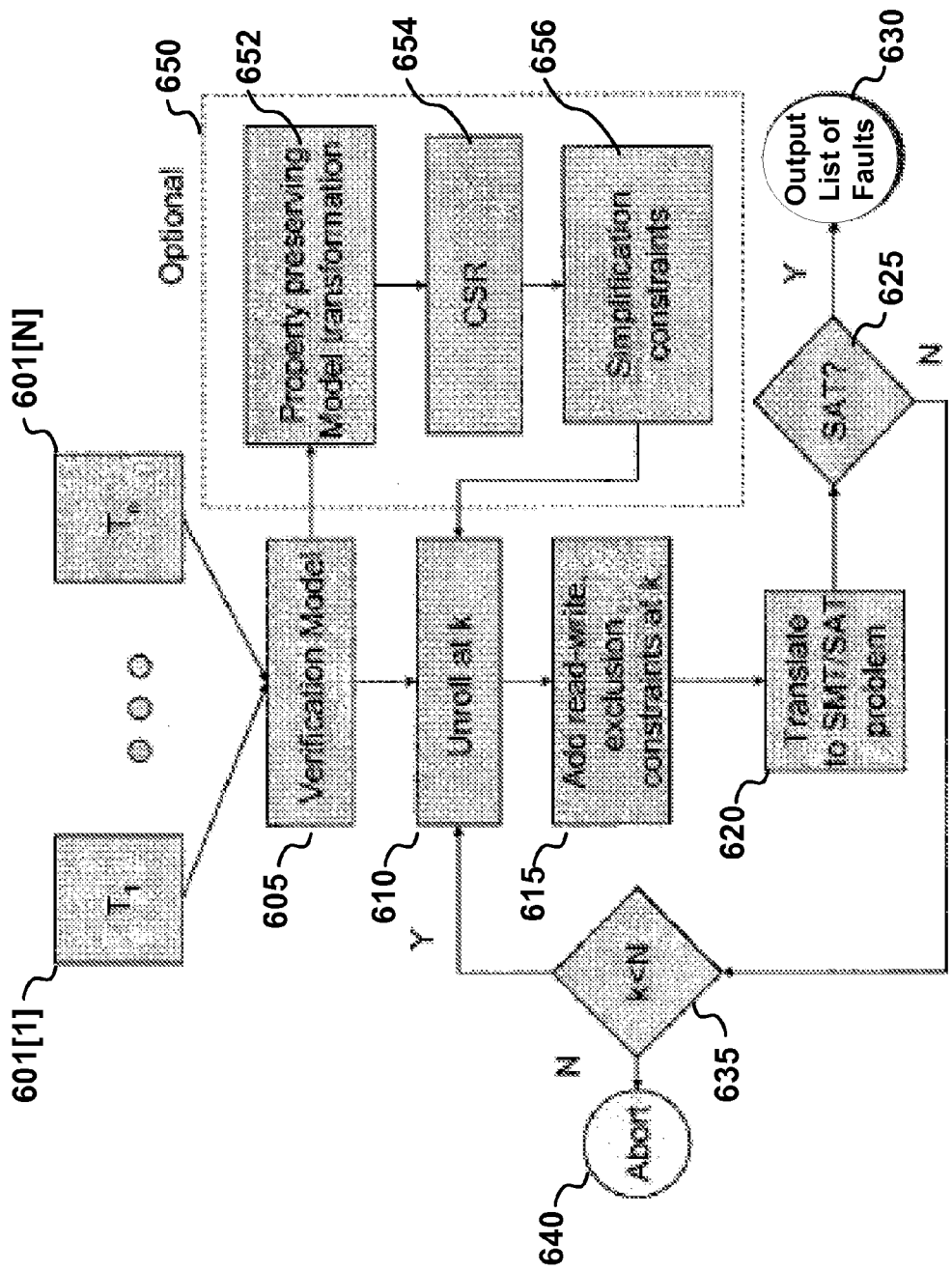
FIG. 6 is a flow chart depicting the overall method according to the present invention.

With reference now to FIG. 6 there is shown a flowchart depicting the overall method of the present invention. More particularly, for a number of threads 601 [1] . . . 601 [N] comprising a concurrent system, a number of independent models 605 are generated—each of which is a sound abstraction of the corresponding thread. As noted earlier, these models do not have any wait cycles.

Each model is unrolled at depth k 610 independently during BMC with the possibility of different unroll depths for different models. Constraints are added 615 between each pair of inter-model control states with shared accesses, that are statically reachable at the corresponding thread-specific depths.

As noted earlier, these constraints guarantee sequential consistency by allowing sufficient context-switching to maintain the read value property and sequentializing the context switches to enforce a common total order.

At each BMC untoll depth, the added constraints capture precisely those concurrent behaviors that are added due to increases in analysis depth. These newly added constraints are computed on the fly. Thus the constraints are added lazily, incrementally, and on-the-fly at each unroll.

A SMT determination is made 620, 625 and a list of faults is produced as indicated 630.

Evaluations

We evaluated our inventive method using the Daisy file system [32], a public benchmark used to evaluate and compare various concurrency verification techniques for concurrent threads communicating with shared memory and locks/unlocks. It is a 1KLOC Java implementation of a representative file system, where each file is allocated a unique inode that stores the file parameters, and a unique block which stores data. Each access to a file, inode or block I sguarded by a dedicated lock. Since a thread does not guarantee exclusive operations on byte access, potential race conditions exist. This system has some known data races.

For our experiment, we used a C version of the code [16] annotated as described earlier. Note that we did not inline any procedure calls. Our EFSM model extracted for a single thread has 101 control states, 80 state variables and 14 state Boolean variables, 90 input variables and 528 input Boolean variables. The datapath elements include 54 adders, 696 if-then-else, 217 constant multipliers, 4 inequalities, and 510 equalities. We consider a two-thread concurrent system in our experiment.

We conducted our experiments on an SMT-based BMC framework similar to [26]. We used the yices-1.0 [37] SMT solver at the back end. We compared our lazy modeling approach with an eager modeling approach where we add the pair-wise constraints in the model itself between the shared states with wait-cycles. We applied BMC simplification using CSR as discussed earlier for all cases—referred to as the baseline strategy. We then combined this baseline strategy with other static analysis techniques such as path balancing/loop CFG transformations (PB) on CFG [26], context-sensitive analysis (CXT), and lockset analysis (MTX) [8, 9, 16]. Finally, we conducted controlled experiments with various combinations of these techniques.

Comparing CSR on Lazy and Eager Modeling

Figure 5:
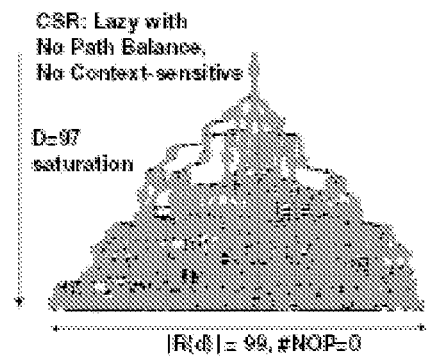
FIG. 5 is a series of graphs comparing CSR on lazy and eager models.
Figure 5:
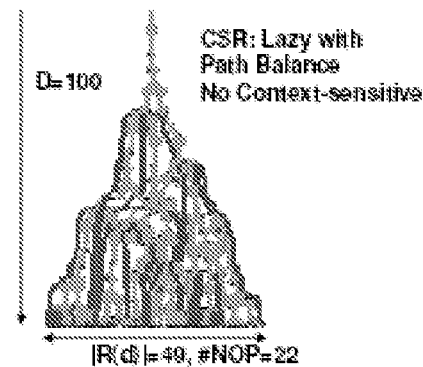
Figure 5:
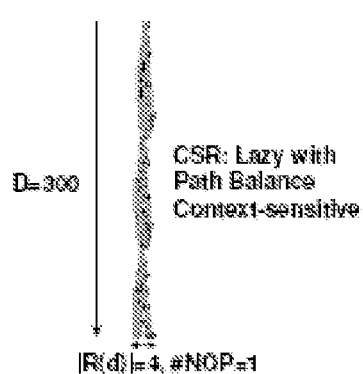
Figure 5:
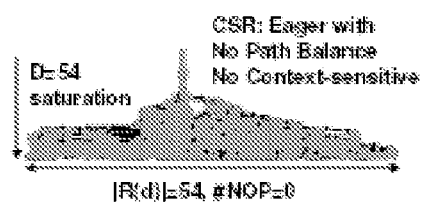
Figure 5:
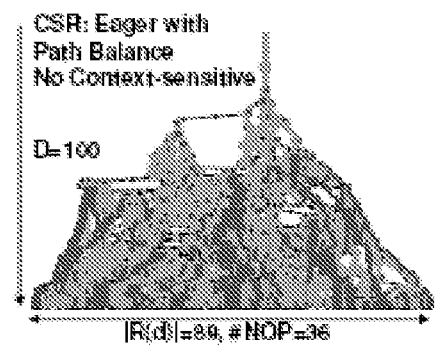
Figure 5:
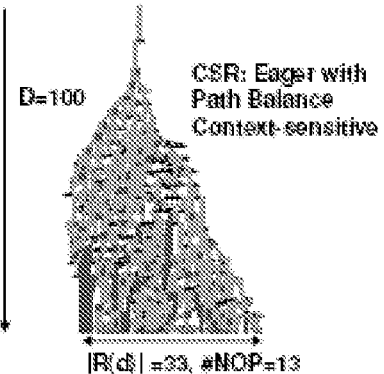

We may now show a comparison of CSR as performed on eager and lazy models for the following cases:

CSR: model with no PB and no CXT;
CSR+PB: model with PB, but no CXT; and
CSR+PB+CXT: model with PB and CXT The reachability graphs on the lazy and eager models are shown in FIGS. 5(a)-(c) and (d)-(f) respectively. Note the width of the graph is proportional to |R(d)|, i.e., the number of control states statically reachable at depth d from an initial state. It is desirable that the width is small in order to obtain greater scope of reduction of BMC instance sizes. We observe that the lazy modeling and CXT method reduce R(d) significantly. Thus, we believe that lazy modeling with CSR+PB+CXT has the greatest potential for improving BMC.

Comparing BMC Results

We now compare the performance of SMB-based BMC on detecting multiple data races on both eager and lazy models in various combinations of strategies. We conducted our experiments on a workstation with dual Intel 2.8 Ghz Xeon Processors with 4 GB physical memory running Red Hat Linux 7.2 while imposing a 6 hr (~20 Ks) time limit and a 300 unroll bound limit for each BMC run.

The results of our experiments are summarized in Table 1. With reference to that table, Column 1 shows the modeling approach (eager/lazy); Columns 2-6 show BMC results for various combinations of static analysis methods.

Each data point (d:t,m) corresponds to a performance summary of BMC run up to depth d with t and m representing the cumulative run time and memory used, respectively. Note, cumulative time includes the solve time incurred in the previous depths for the same run. We show a selected few data points for comparison. Specifically, Column 2 shows data for CSR with no PB and no CXT; Column 3 shows data for CSR with PB and no CXT; Column 4 shows data for CSR with PB and CXT; Column 5 shows data for CSR with PB, CXT and MTX; and Column 6 shows data for CSR with PB and MTX, but no CXT.

For eager modeling—due to non-inlining of procedure calls—we did not obtain any useful lockset information to reduce the constraints statically, and therefore results in the columns (CSR+PB+CXT+MTX) and (CSR+PB+MTX) are the same (CSR+PB+CXT) and (CSR+PB), respectively. As an example, consider BMC at unroll depth 64. BMC on eager model with CSR times out (TO) requiring 66 Mb, while our lazy model with CSR it takes only 26 seconds and 39 Mb.

In general, PB and CXT help BMC go deeper in both the eager and lazy models. However, CXT has a pronounced effect on the BMC performance. We have also observed that the lockset static analysis helps improve the BMC performance—but not significantly. Generally speaking, BMC on an eager model does not go very deep and times out in all cases without detecting any data races. In sharp contrast BMC on lazy models—according to the present invention—with (CSR+PB+CXT) or (CSR+PB+CXT+MTX) is able to find 50 data races in a single BMC run!

In Table 2, there is shown details of BMC performance on lazy models using CSR+PB+CXT+MTX on the first five data races. Column 1 shows the data races listed in the order of detection. Columns 2-4 show the BMC depth, cumulative time, and memory used, respectively. Column 5 shows the context-switches in the trace, each denoted as $(P_i: k_i, l_i) \rightarrow (P_j: k_j, l_j)$ wherein model $P_i$ executed uninterrupted from depth $k_i$ to $l_i$, and then switches the context to $P_j$ at depth $k_j$.

As an example, consider that the first data race is detected at depth 143 taking 12 seconds and 10 Mb. The SMT call to find the witness takes <1 s (not shown). There are 3 context switches a $P_1$ run from a depth of 0 to 127, followed by a $P_2$ run from a depth of 0 to 127, followed by another $P_1$ run from 128 to 142, followed by a data race detection when $P_2$ accesses the same variable at a depth of 128. Note that the length of the trace is 271(=143+128).

Comparisons of our Approach with Other Work

As can now be readily appreciated by those skilled in the art, our lazy modeling method differs significantly from eager modeling approaches as applied to symbolic model checking of concurrent system. More particularly—and according to the present invention—we employ lazy addition of concurrency constraints, allow no wait-cycles, make effective use of static information, use SMT-based BMC and explore deeper traces.

While we have described our inventive method and approach using a number of specific examples, our invention is not so limited. Accordingly, the invention should be only limited by the scope of the claims attached hereto

TABLE 1

Table 1. Comparing SMT-based BMC on Lazy/Eager Models

| | Static Analysis Strategies | | | | |
|---|---|---|---|---|---|
| Model | CSR (1) | CSR + PB (2) | CSR + PB + CXT (3) | CSR + PB + CXT + MTX (4) | CSR + PB + MTX (5) |
| | d: t, m with d = BMC Depth, t = Cum. Time(s), m = Mem(Mb) | | | | |
| Eager race? | 64: TO, 66 | 64: 132, 21 95: TO, 59 | 64: 10, 14 95: 2K, 31 124: TO, 49 | same as (3) | same as (2) |
| | N | N | N | N | N |
| Lazy race? | 64: 26, 39 73: 8K, 101 Yices aborted | 64: 6, 10 95: 35, 10 118: TO, 114 | 64: 2, 6 95: 5, 8 118: 8, 11 124: 16, 10 287: 2.7K, 34 | 64: 1, 6 95: 4, 8 118: 8, 11 124: 9, 10 287: 2.4K, 32 | 64: 3, 10 95: 17, 28 118: 15K, 108 119: TO, 112 |
| | N | N | 50 races | 50 races | N |

Note:
N = No Race Detected,
* = Yices Aborted,
TO = Time Out (≈20 Ksec)

TABLE 2

Table 2. Sample Data Race Traces using CSR + PB + CXT + MTX on lazy model

| # | BMC depth | Time sec | Mem Mb | Context Switches: $(P_i: k_i, l_i) \rightarrow (P_j: k_j, l_j)$ $P_i$ executes from depths $k_i$ to $l_i$ uninterrupted and context-switches to $P_j$ at depth $k_j$. |
|---|---|---|---|---|
| 1 | 143 | 12 | 10 | (1: 0, 127)→(2: 0, 127)→(1: 128, 142)→(2: 128, —) |
| 2 | 174 | 25 | 13 | (1: 0, 127)→(2: 0, 179)→(1: 128, 173)→(2: 128, —) |
| 3 | 180 | 30 | 15 | (1: 0, 14)→(2: 0, 179)→(1: 15, —) |
| 4 | 211 | 96 | 17 | (1: 0, 127)→(2: 0, 158)→(1: 128, 158)→(2: 159, 210)→(1: 159, —) |
| 5 | 211 | 99 | 18 | (1: 0, 127)→(2: 0, 210)→(1: 128, —) |

The invention claimed is:

1. A computer-implemented method for modeling and verifying a concurrent system for a given memory model, said concurrent system comprising two or more interacting threads wherein each one of the threads communicate with one another using shared variables and synchronization primitives, said method comprising the steps of:
generating n>1 independent models, one for each of the threads, wherein each model is a sound abstraction of its corresponding thread wherein the sound abstraction includes true behaviours and spurious behaviours;
unrolling each one of the n models independently;
adding as needed one or more constraints between one or more pairs of inter-model control states to model inter-thread communication; and
generating a set of violations through bounded analysis.

2. The computer-implemented method of claim 1 wherein said constraints added are between those control states that are statically reachable at corresponding unroll depths.

3. The computer-implemented method of claim 1 wherein each one of the n independent models does not have any wait-cycles.

4. The computer implemented method of claim 1 wherein said constraints are added between those control states that are statically reachable at corresponding unroll depths and each one of the n independent models does not have any wait cycles.

5. The computer-implemented method of claim 1 where the given model is a sequential consistency memory model.

6. The computer-implemented method of claim 5 wherein the unrolled depths for each thread model is different.

7. The computer-implemented method of claim 6 wherein said constraints are incrementally added at each depth d for the n threads.

8. The computer-implemented method of claim 7 wherein multiple violations are detected at given depths of the n threads.

9. The computer-implemented method of claim 8 wherein the set of violations detected include data races, single reachability properties and pair-wise reachability properties.

10. The computer-implemented method of claim 9 wherein said added constraints do not allow any spurious violations wherein spurious violations are violations resulting from the abstraction.

11. The computer-implemented method of claim 9 wherein said added constraints do not miss any true violation up to the unrolled depths of the thread models wherein true violations are violations that do not result from the abstraction.

12. The computer implemented method of claim 9 wherein said added constraints do not allow any spurious violations and do not miss any true violation up to the unroll depths of the thread models wherein true violations are violations that do not result from the abstraction.

13. The computer-implemented method of claim 12 wherein said bounded analysis is performed by a Satifiability Modulo Theory (SMT)-based Bounded Model Check (BMC).

* * * * *